United States Patent
Turner et al.

(10) Patent No.: US 6,699,336 B2
(45) Date of Patent: Mar. 2, 2004

(54) AMORPHOUS ELECTRODE COMPOSITIONS

(75) Inventors: Robert L. Turner, Woodbury, MN (US); Brian D. Fredericksen, Watertown, MN (US); Larry J. Krause, Stillwater, MN (US); Jeffrey R. Dahn, Hubley (CA); Dominique C. Larcher, Amiens (FR); Ian A. Courtney, St. Francis, MN (US); Ou Mao, New Milford, CT (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/751,169

(22) Filed: Dec. 29, 2000

(65) Prior Publication Data

US 2002/0162606 A1 Nov. 7, 2002

Related U.S. Application Data

(60) Provisional application No. 60/175,893, filed on Jan. 13, 2000.

(51) Int. Cl.[7] ............................................. C22C 45/00
(52) U.S. Cl. .................... 148/403; 204/293; 427/231.95
(58) Field of Search .................. 148/403; 204/293; 429/218.1, 231.95

(56) References Cited

U.S. PATENT DOCUMENTS

| | | | |
|---|---|---|---|
| 4,623,597 A | * | 11/1986 | Sapru et al. ................ 420/900 |
| 4,731,133 A | * | 3/1988 | Dermarker ................... 148/403 |
| 4,751,086 A | | 6/1988 | Jeffrey et al. |
| 4,948,558 A | | 8/1990 | Skinner et al. |
| 5,209,995 A | | 5/1993 | Tada et al. |
| 5,554,456 A | | 9/1996 | Ovshinsky et al. |
| 5,556,721 A | | 9/1996 | Sasaki et al. |
| 5,721,065 A | | 2/1998 | Collien et al. |
| 5,789,114 A | | 8/1998 | Adachi et al. |
| 5,840,440 A | | 11/1998 | Ovshinsky et al. |
| 5,922,491 A | | 7/1999 | Ikawa et al. |
| 6,030,726 A | * | 2/2000 | Takeuchi et al. ......... 429/231.95 |
| 6,203,944 B1 | | 3/2001 | Turner et al. |
| 6,428,933 B1 | * | 8/2002 | Christensen et al. ... 429/231.95 |
| 6,436,578 B2 | * | 8/2002 | Turner et al. ........... 429/231.95 |
| 6,528,208 B1 | * | 3/2003 | Thackeray et al. ....... 429/218.1 |
| 2002/0001749 A1 | * | 1/2002 | Hashimoto et al. ...... 429/218.1 |
| 2002/0055041 A1 | * | 5/2002 | Kobayashi et al. ..... 429/231.95 |

FOREIGN PATENT DOCUMENTS

| | | |
|---|---|---|
| EP | 0 209 402 A1 | 1/1987 |
| EP | 0 750 359 B1 | 8/1999 |
| EP | 1 024 544 A2 | 8/2000 |
| EP | 1 028 476 A1 | 8/2000 |
| EP | 1 033 767 A1 | 9/2000 |
| EP | 1 039 568 A1 | 9/2000 |
| JP | 6-325764 | 11/1994 |
| JP | 7-296812 | 11/1995 |
| JP | 10-223221 | 8/1998 |
| JP | 10-294112 | 11/1998 |
| WO | WO 99/49532 | 9/1999 |
| WO | WO 00/03444 | 1/2000 |
| WO | WO 00/60691 | 10/2000 |

* cited by examiner

Primary Examiner—George Wyszomierski

(57) ABSTRACT

An electrode composition that includes an electrode material consisting essentially of at least one electrochemically inactive elemental metal and at least one electrochemically active elemental metal in the form of an amorphous mixture at ambient temperature. The mixture remains amorphous when the electrode composition is incorporated into a lithium battery and cycled through at least one full charge-discharge cycle at ambient temperature.

4 Claims, 15 Drawing Sheets

AMORPHOUS ELECTRODE COMPOSITIONS

STATEMENT OF PRIORITY

This application derives priority from a provisional application filed on Jan. 13, 2000 bearing ser. No. 60/175,893 which is hereby incorporated by reference in its entirety.

TECHNICAL FIELD

This invention relates to electrode materials useful in secondary lithium batteries.

BACKGROUND OF THE INVENTION

Two classes of materials have been proposed as anodes for secondary lithium batteries. One class includes materials such as graphite and other forms of carbon, which are capable of intercalating lithium. While the intercalation anodes generally exhibit good cycle life and coulombic efficiency, their capacity is relatively low. A second class includes metals that alloy with lithium metal. Although these alloy-type anodes generally exhibit higher capacities relative to intercalation-type anodes, they suffer from relatively poor cycle life and coulombic efficiency.

SUMMARY OF THE INVENTION

The invention provides electrode compositions suitable for use in secondary lithium batteries in which the electrode compositions have high initial capacities that are retained even after repeated cycling. The electrode compositions, and batteries incorporating these compositions, are also readily manufactured.

To achieve these objectives, the invention features an electrode composition that includes an electrode material consisting essentially of at least one electrochemically inactive elemental metal and at least one electrochemically active elemental metal in the form of an amorphous mixture at ambient temperature. The electrode material is essentially free of intermetallic compounds. The mixture of elemental metals remains amorphous when the electrode composition is incorporated into a lithium battery and cycled through at least one full charge-discharge cycle at ambient temperature. Preferably, the mixture remains amorphous after cycling through at least 10 cycles, more preferably at least 100 cycles, and even more preferably at least 1000 cycles.

An "electrochemically active elemental metal" is a metal that reacts with lithium under conditions typically encountered during charging and discharging in a lithium battery. An "electrochemically inactive elemental metal" is a metal that does not react with lithium under those conditions.

An "amorphous mixture" is a mixture that lacks the long range atomic order characteristic of crystalline material. The existence of an amorphous mixture can be confirmed using techniques such as x-ray diffraction, transmission electron microscopy, and differential scanning calorimetry.

When incorporated in a lithium battery, the electrode composition preferably exhibits (a) a specific capacity of at least about 100 mAh per gram of active metal for 30 full charge-discharge cycles and (b) a coulombic efficiency of at least 99% (preferably at least 99.5%, more preferably at least 99.9%) for 30 full charge-discharge cycles when cycled to realize about 100 mAh per gram of active metal of the composition. Preferably, this level of performance is realized for 500 cycles, more preferably for 1000 cycles.

In another preferred embodiment, the electrode composition, when incorporated in a lithium battery, exhibits (a) a specific capacity of at least about 500 mAh per gram of active metal for 30 full charge-discharge cycles and (b) a coulombic efficiency of at least 99% (preferably at least 99.5%, more preferably at least 99.9%) for 30 full charge-discharge cycles when cycled to realize about 500 mAh per gram of active metal of the composition. Preferably, this level of performance is realized for 200 cycles, more preferably for 500 cycles.

The electrode composition can be in the form of a thin film or a powder. Thin films can be prepared using a number of techniques, including sputtering and melt spinning. Examples of suitable electrochemically active elemental metals include aluminum, silicon, tin, antimony, lead, germanium, magnesium, zinc, cadmium, bismuth, and indium. Examples of suitable electrochemically inactive elemental metals include Group IB through Group VIIB elemental metals, as well as group VIII and rare earth elemental metals. Specific examples include Ti, V, Cr, Mn, Fe, Co, Ni, Cu, Y, Zr, Nb, Mo, La, Hf, Ta, W, Ce, Pr, Nd, Eu, Gd, Tb, Dy, Ho, Er, Yb, Lu, Be, and Sm. Of this group, molybdenum, niobium, tungsten, tantalum, iron, nickel, manganese, and copper are preferred.

Lithium batteries including the above-described electrode compositions may be used as power supplies in a variety of applications. Examples include power supplies for motor vehicles, computers, power tools, and telecommunications devices.

Other features and advantages of the invention will be apparent from the following description of the preferred embodiments thereof, and from the claims.

DETAILED DESCRIPTION

Figure 1:
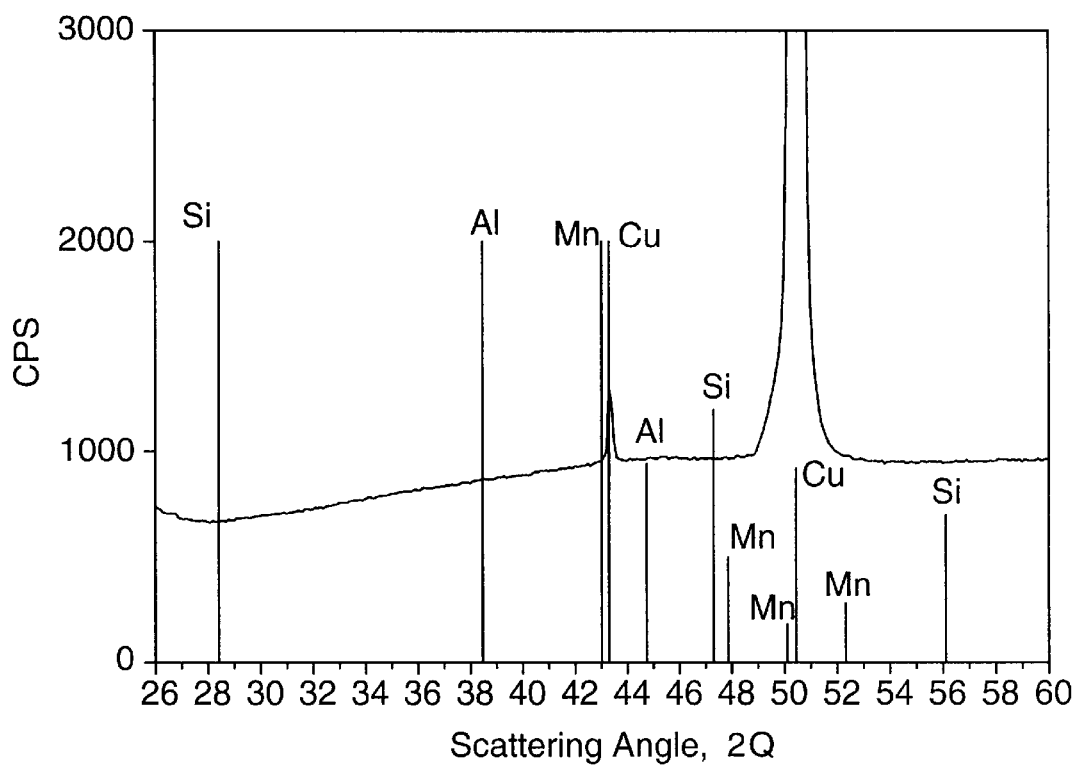
FIG. 1 is a 1 is an x-ray diffraction profile for the aluminum-silicon-manganese sample described in Example 1, obtained prior to cycling.

The electrode compositions have the chemical composition and microstructure described in the Summary of the Invention, above. They may be in the form of thin films or powders. The thin films may be prepared using techniques such as chemical and vapor deposition, vacuum deposition (i.e., sputtering), vacuum evaporation, melt spinning, splat cooling, spray atomization, electrochemical deposition, and the like. The powders may be prepared directly using techniques such as ball-milling or chemical reduction of active metal. Alternatively, the powders may be prepared in the form of thin films and then pulverized to form powders.

The electrode compositions are particularly useful in secondary lithium batteries. To prepare a battery, the film containing the active material is used directly as the electrode. Alternatively, if the active material is in the form of a powder, the powder is combined with a binder (e.g., a polyvinylidene fluoride binder) and solvent to form a slurry which is then coated onto a backing using conventional coating techniques and dried to form the electrode. The electrode is then combined with an electrolyte and a counterelectrode.

The electrolyte may be a solid or liquid electrolyte. Examples of solid electrolytes include polymeric electrolytes such as polyethylene oxide, polytetrafluoroethylene, fluorine-containing copolymers, and combinations thereof. Examples of liquid electrolytes include ethylene carbonate, diethyl carbonate, propylene carbonate, and combinations thereof. The electrolyte is provided with a lithium electrolyte salt. Examples of suitable salts include $LiPF_6$, $LiBF_4$, and $LiClO_4$.

Examples of suitable counterelectrode compositions for liquid electrolyte-containing batteries include $LiCoO_2$, $LiCo_{0.2}Ni_{0.8}O_2$, and $LiMn_2O_4$. Examples of suitable counterelectrode compositions for solid electrolyte-containing batteries include $LiV_3O_8$ and $LiV_2O_5$.

The invention will now be described further by way of the following examples.

EXAMPLES

A. Electrode Preparation

Electrode materials were prepared in the form of thin films either by sputtering or by melt spinning according to the following procedures.

Sputtering Procedure #1

Electrodes in the form of thin films were prepared by sequential or single target sputtering using a modified Perkin-Elmer Randex Model 2400-8SA Sputtering System. The original 8 inch diameter of sputter sources were replaced with 6 inch diameter dc magnetron sputtering sources commercially available from Materials Science of San Diego Calif. The sputtering sources were powered using Advanced Energy Model MDX-10 dc sputtering power supplies operating in constant current mode. The turntable drive unit of the Randex System was replaced with a stepper motor to improve rotation speed range and control. The System was pumped with an untrapped oil diffusion pump backed by a conventional rotary vane pump.

Sputtering was performed at argon pressures in the range of 3–30 mTorr. The pressure was maintained by controlling the argon flow in combination with a venetian blind-style conductance limiter placed over the diffusion pump.

A copper foil (thickness=0.001 inch) was bonded to the water-cooled substrate turntable of the Randex System using double sided adhesive tape (3M Brand Y9415, commercially available from 3M Company of St. Paul, Minn.). The system was closed and pumped down, typically to base pressures below $1 \times 10^{-5}$ Torr (the base pressure prior to deposition is not critical). The samples were etched prior to deposition using the "Sputter Etch" mode of the Randex System with 13.56 MHz power applied to the substrate turntable and an argon pressure of 8 mTorr in the sputtering chamber. This procedure caused the copper foil surface to be bombarded with moderate energy argon ions (100–150 eV) to further clean the copper and insure good adhesion of the sputtered film to the copper surface. A typical cleaning cycle was 150W for 30 minutes, with the substrate table rotating during the cycle.

Following etching, the sputtering sources were started up using a mechanical shutter between the sources and the copper substrate. This removed contaminants from the source surface without depositing them on the substrate surface. Next, both sources were started up at predetermined current levels and deposition initiated. After a suitable deposition time, one or both sources were turned off.

Sputtering Procedure #2

Films were prepared using a sputtering coater consisting of a conventional web handling system driving a 6 inch wide web over a water-cooled chill roll opposing three 6 inch long water-cooled sputtering targets. A multitude of water-cooled shields confined the sputtering plasma and defined the exposed area of the moving web. The coater was evacuated using a CTI-CRYOGENICS ON-BORD® high vacuum cryo pump and a Leybold high vacuum turbo pump model 220 backed by a conventional roughing pump. The targets were powered by an ADVANCED ENERGY MDX II dc power supply operated in constant power mode. Sputtering was performed at 30 mTorr in an argon atmosphere. Adjusting the sputtering power and the web speed controlled the amount of deposited material (coating weight).

Melt Spinning Procedure

In preparation for melt spinning, ingots of the metal mixture were prepared as follows. A mixture of metal pieces was placed in a 50 mL alumina crucible (Vesuvius McDaniel, Beaver Falls, Pa.). The crucible was placed into a graphite fiber-wound susceptor and the crucible-containing susceptor was placed into the copper coil of a Model 2030 GCA Vacuum Induction Furnace (Centor Vacuum Industries, Nashua, N.H.). The furnace was evacuated to a vacuum of about 0.05 mTorr, the radio frequency power supply was turned on, and the mixture was heated and melted for about 1 hour to ensure alloying. After cooling, the resulting ingot was removed from the crucible and broken with a hammer into smaller pieces to form sample pieces for melt spinning.

The melt spinning process was conducted as follows. A standard quartz nozzle for melt spinning was ground using 1000 grit sandpaper to create an orifice at the tip measuring 0.030 inch in diameter. A number of sample pieces were inserted into the nozzle and suspended in a copper coil inside a vacuum chamber. The quartz tube was connected to tubing that supplied pressurized nitrogen to the nozzle. The nozzle was adjusted so that a height of 0.048 inch was obtained between the nozzle tip and the surface of an 8 inch diameter Cu/Be wheel. The chamber was evacuated to 66 mTorr and an overpressure of 30 mm Hg was obtained between a nitrogen storage tank and the inside of the vacuum chamber. The motor/belt driven Cu/Be wheel was rotated at a speed of 2500 rpm and a sufficient radio frequency power was supplied to the copper coil to melt the alloy pieces in the induction field. When the pieces had liquefied, nitrogen gas was applied to the nozzle to cause the molten metal to be ejected onto the surface of the rotating Cu/Be wheel. The process produced a ductile ribbon having a width of 12 mm and a thickness of 0.0012 inch.

B. Transmission Electron Microscopy

Transmission electron microscopy ("TEM") was used to examine the microstructure of the electrode samples before cycling. This technique produces images of the microstructure using spatial variations in transmitted intensity associated with spatial variations in the structure, chemistry, and/or thickness of the sample. Because the radiation used to form these images consists of high energy electrons of very short wavelength, it is possible to obtain information at the atomic scale under high resolution electron microscopy (HREM) imaging conditions. Moreover, the interaction of these electrons with the sample produces information about the crystal structure (electron diffraction) and local chemistry (x-ray microanalysis) that is complementary to the information contained in the image.

Prior to cycling, samples were prepared from melt spun films by cutting the film in random directions. The cut samples were then embedded in 3M Scotchcast™ Electrical Resin #5 (commercially available from 3M Company of St. Paul, Minn.) and ultramicrotomed to obtain slices thin enough for TEM examination. Slice thickness was nominally 24 nm.

The TEM instrumentation used to obtain microstructural data was a HITACHI H9000-NAR transmission electron microscope which operates at an accelerating voltage of 300 kV. It is capable of a point-to-point resolution of 1.75 angstroms and a microprobe resolution of 16 angstroms for x-ray microanalysis. The microanalysis instrumentation consisted of a NORAN VOYAGER III. Direct-to-digital image acquisition and quantitative length measurements were performed by a GATAN slow-scan CCD (charged-couple device) camera. Z-contrast images were generated using a JEOL 2010-F field emission TEM/STEM having a resolution limit for both imaging and microanalysis of 1.4 angstroms.

C. X-Ray Diffraction

Diffraction patterns were collected using a Siemens Model Kristalloflex 805 D500 diffractometer equipped with a copper or molybdenum target x-ray tube and a diffracted beam monochromator. Approximately 2 $cm^2$ samples of the thin film were mounted on the sample holder. All the sputter-deposited samples were on a copper substrate which gives rise to a series of identifiable diffraction peaks at particular scattering angles. Specifically, the copper substrate gives rise to peaks at scattering angles of 43.30 degrees, 50.43 degrees, and 74.13 degrees, corresponding to Cu(111), Cu(200), and Cu(220), respectively.

To examine the electrode material during cycling, in-situ x-ray diffraction experiments were performed at room temperature using a 2325 coin cell. The cell was constructed using a 50 micrometer thick microporous polypropylene separator and a lithium negative electrode. The electrolyte was 1 molal $LiPF_6$ in a 1:1 v/v mixture of ethylene carbonate and diethyl carbonate. The coin cell can was further provided with a circular hole measuring 18 mm in diameter. A 21 mm diameter beryllium window (thickness=250 micrometers) was affixed to the inside of the hole using a pressure sensitive adhesive (Roscobond from Rosco of Port Chester, N.Y.). The electrode material was prepared by combining 85 wt. % active powder, 10 wt. % Super-S carbon black (MMM Carbon, Belgium), and 5 wt. % polyvinylidene fluoride to form a coatable composition, and then coating this composition directly onto the window before it was attached to the can.

The cell was assembled and crimped closed in an argon-filled glove box. It was tested with constant charge and discharge currents (30 mA/g) and cycled between fixed capacity limits using a MACCOR cycler. The first discharge was to a limit of 660 mAh/g. The first charge was to 1.3V, and over 600 mAh/g of lithium was extracted. The next discharge was to 720 mAh/g.

The cell was mounted in a Siemens D5000 diffractometer, and slowly discharged and charged between 0.0V and 1.3V. The x-ray diffractometer was repeatedly scanned every three hours. The testing current was selected so that the discharge to 600 mAh/g would take about 20 hours. Two hour x-ray diffraction patterns were collected sequentially during the charge and discharge.

We now describe the preparation and characterization of specific electrode samples.

EXAMPLE 1

An amorphous film containing 54 wt. % aluminum, 28 wt. % silicon, and 18 wt. % manganese was prepared by sputter deposition according to Sputtering Procedure #1 described above from a single target using a current of 1 amp for 120 minutes under 15 mTorr of argon and a sample rotation rate of 38 rpm. The ternary single target material was sputter deposited at a rate of 230 angstroms/minutes. The sputter-deposited film had a thickness of 2.8 microns and a density of about 2.9 $g/cm^3$. There were no pre- or post-layers.

The x-ray diffraction profile of the film was measured according to the procedure described above using a molybdenum target x-ray tube and is set forth in FIG. 1. The pattern shows no peaks for crystalline aluminum, silicon, or manganese, or crystalline intermetallic compounds of AlSiMn. All peaks present originate from copper used in the sample backing.

The cycling behavior of the film was tested as follows. An electrode was cut from the sputtered film with a die measuring 7.1 mm. The test cell was a half cell in which the film formed the cathode and a lithium foil (about 300 micrometers thick, available from Aldrich Chemical Co. of Milwaukee, Wis.) formed the anode of a 1225 coin cell.

The cell was constructed using a 50 micrometer thick polyethylene separator. The electrolyte was 1 molal $LiPF_6$ in a 1:1 v/v mixture of ethylene carbonate and diethyl carbonate. Copper spacers were used as current collectors and to fill void areas in the cell.

Figure 2A:
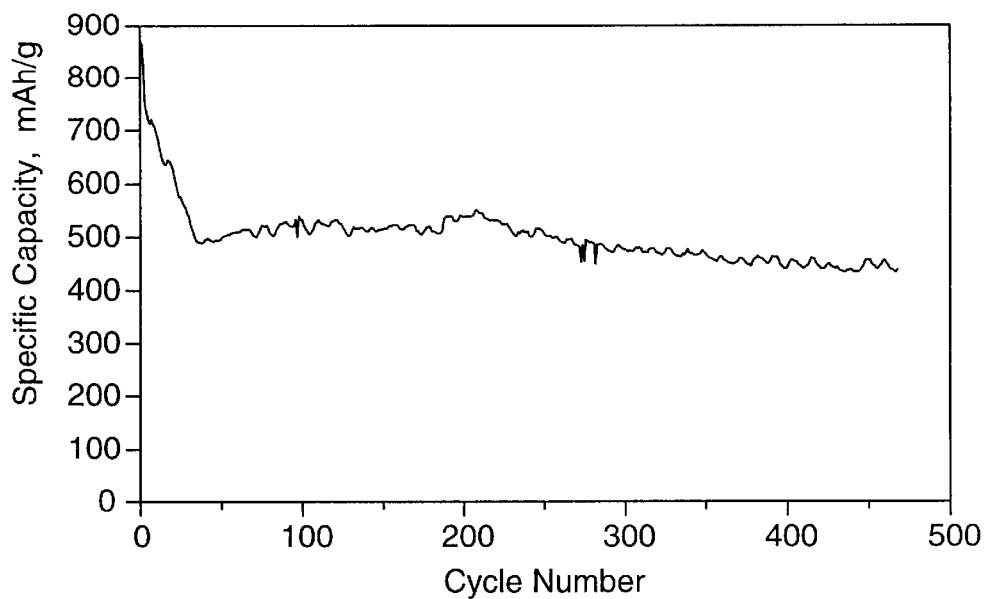
FIG. 2A illustrates the cycling performance, in terms of reversible specific capacity, of the aluminum-silicon-manganese sample described in Example 1.
Figure 2B:
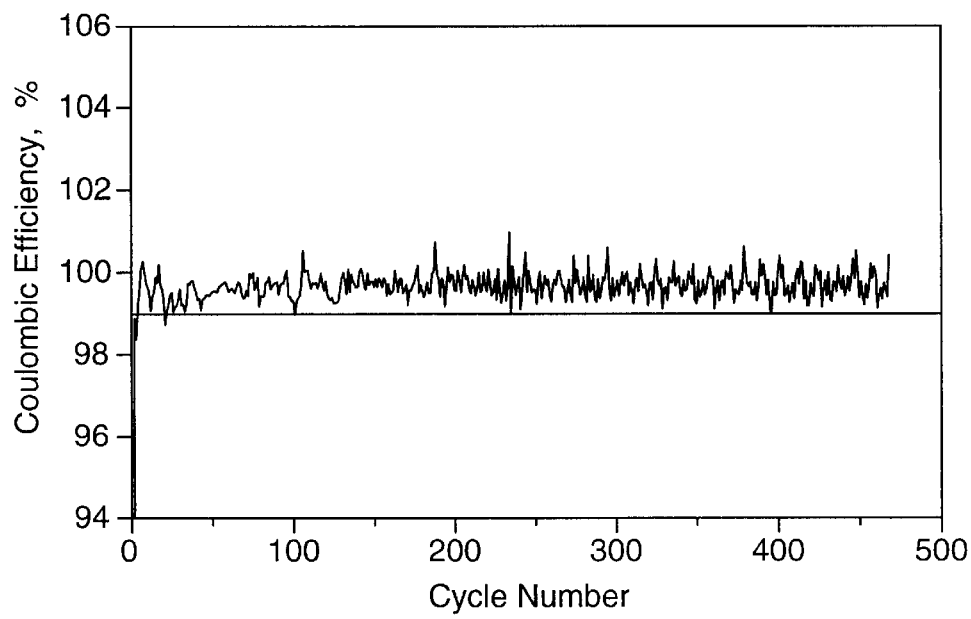
FIG. 2B illustrates the cycling performance, in terms of coulombic efficiency, of the aluminum-silicon-manganese sample described in Example 1.

The electrochemical performance of the cell was measured using a MACCOR cycler. The first discharge of the cell was a constant current discharge at 0.5 $mA/cm^2$ down to 5 mV and then a constant voltage (5 mV) discharge until the current fell to 50 microamps/cm². The initial discharge (lithiation) specific capacity was about 1400 mAh/g. The cell was then cycled under conditions set for constant current charge and discharge at approximately a C/3 rate (0.5 mA/cm²) with cutoff voltages of 5 mV and 1.4 V. The reversible specific capacity and coulombic efficiency of the cell are shown in FIGS. 2A and 2B, respectively. The results demonstrate that the electrode film will reversibly cycle at greater than 450 mAh/g for at least 450 cycles with a coulombic efficiency that is greater than 99.0%.

Figure 3:
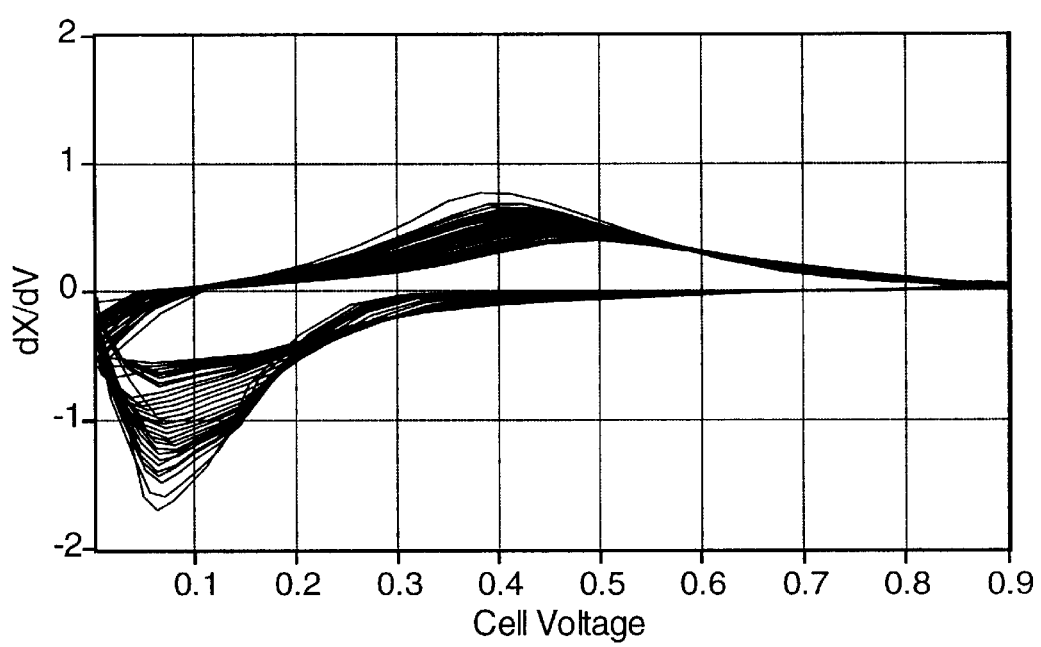
FIG. 3 is a differential voltage curve obtained for the aluminum-silicon-manganese sample described in Example 1.

The differential voltage curve for the electrode is shown in FIG. 3. The curve shows that there are no significant changes in the electrochemical behavior of the electrode during cycling, indicating that no large crystalline regions developed upon cycling.

EXAMPLE 2

Figure 4:
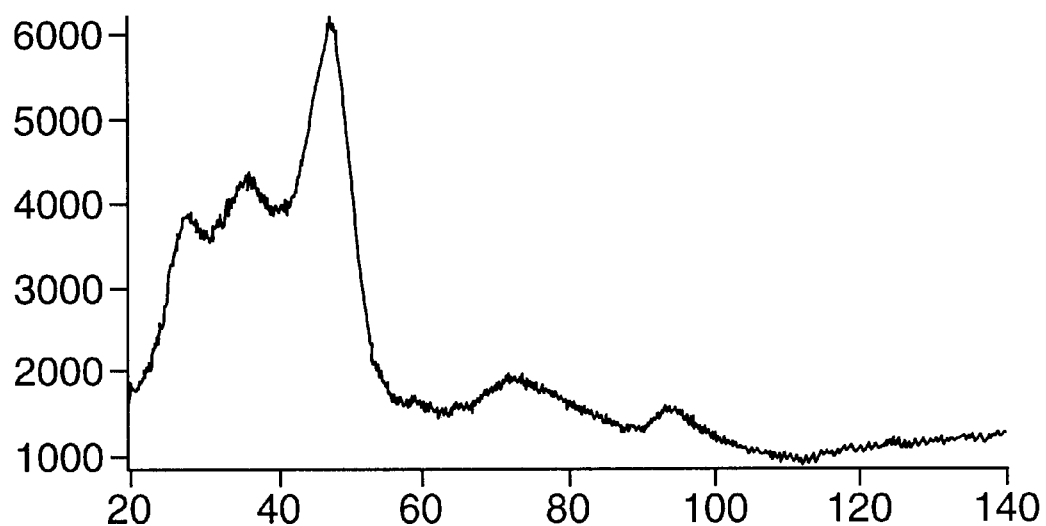
FIG. 4 is an x-ray diffraction profile for the germanium-nickel-silicon-aluminum sample described in Example 2, obtained prior to cycling.

An amorphous melt-spun film containing 20 wt. % germanium, 10 wt. % nickel, 10 wt. % silicon, and 60 wt. % aluminum was prepared according to the procedure described above. The x-ray diffraction profile of the film was measured according to the procedure described above using a copper target x-ray tube. A step size of 0.05 degrees and a scan time of 5 seconds were used. The results are set forth in FIG. 4. As shown in FIG. 4, the profile lacks sharp peaks characteristic of a crystalline material.

Figure 5:
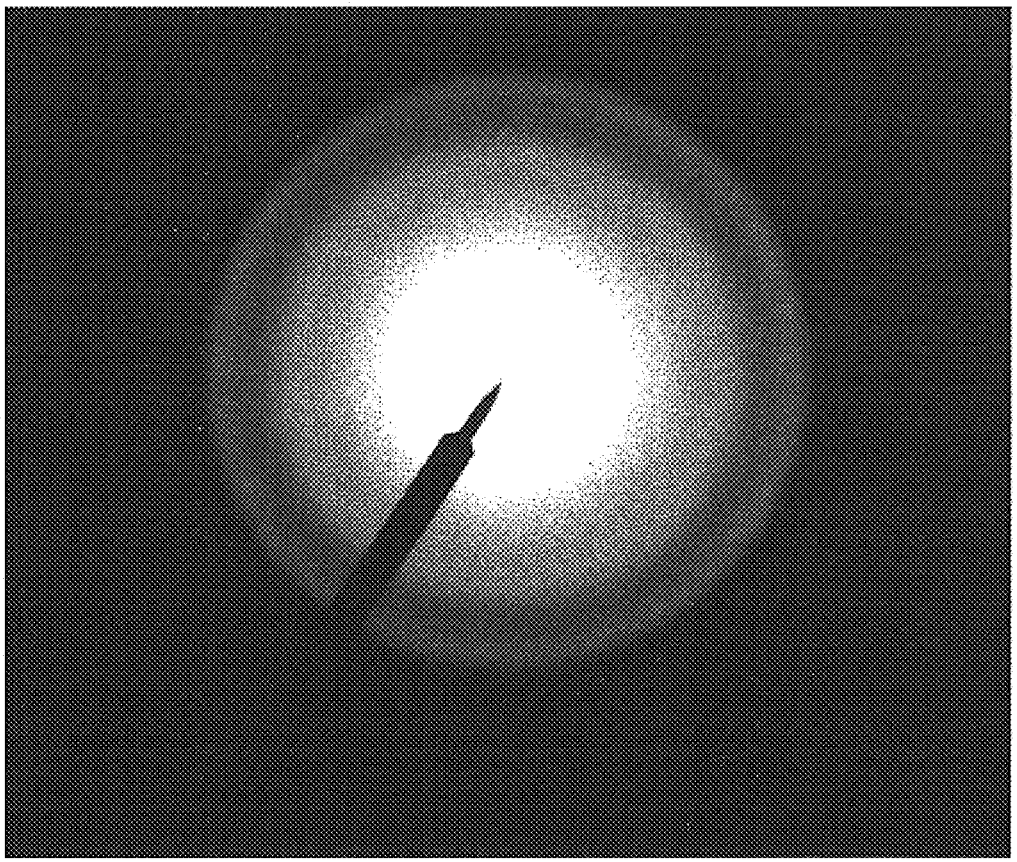
FIG. 5 is a TEM diffraction pattern for the germanium-nickel-silicon-aluminum sample described in Example 2, obtained prior to cycling.
Figure 6:
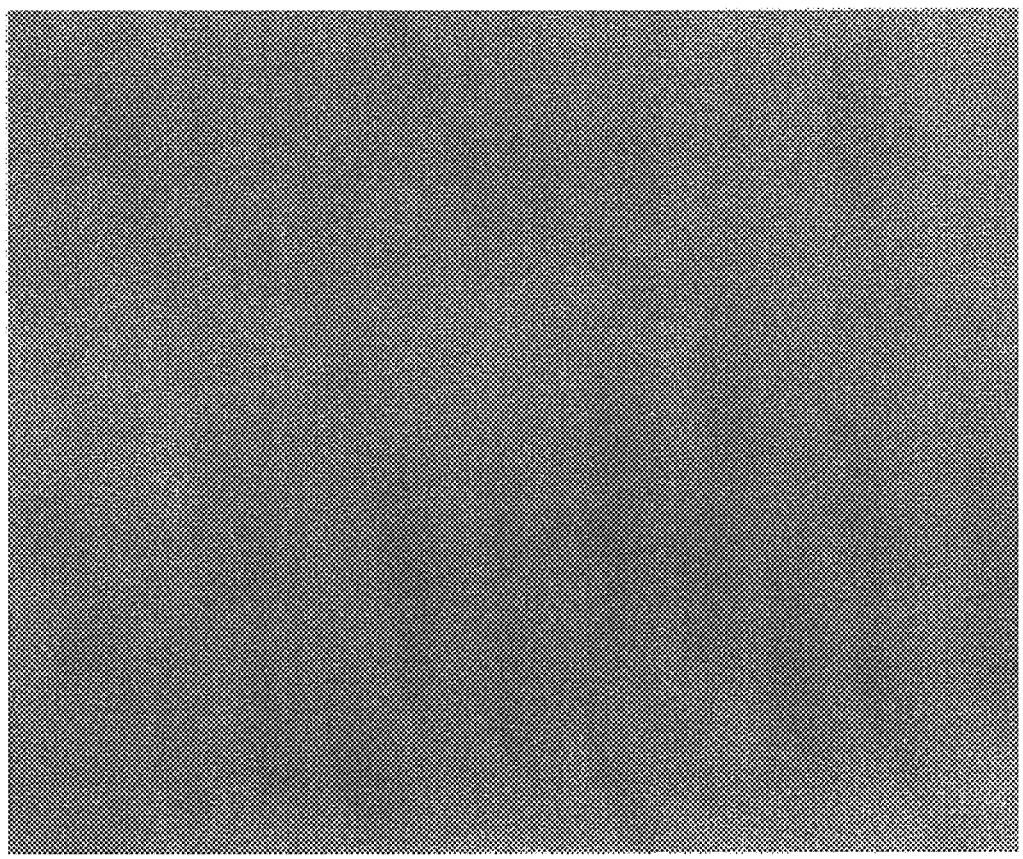
FIG. 6 is a TEM photomicrograph of the germanium-nickel-silicon-aluminum sample described in Example 2, obtained prior to cycling.

The film was also subjected to TEM and electron diffraction analysis prior to cycling according to the procedure described above. The TEM diffraction pattern of the film, set forth in FIG. 5, lacks sharp rings or spots characteristic of a crystalline material. A TEM photomicrograph, shown in FIG. 6, likewise lacks features characteristic of a crystalline material.

The cycling behavior of the film was tested as follows. An electrode was prepared from two strips of the melt-spun film, one measuring 15.11 mm long by 1.15 mm wide and the other measuring 7.76 mm by 1.15 mm wide. The test cell was a half cell in which the film formed the cathode and a lithium foil (about 0.015 inch thick and 17 mm in diameter) formed the anode of a 2325 coin cell. The cell was constructed using a 0.001 inch thick Celgard LLC separator (Celgard of Charlotte, N.C.). The electrolyte was 1 molal LiPF₆ in a 1:1 v/v mixture of ethylene carbonate and diethyl carbonate.

Figure 7:
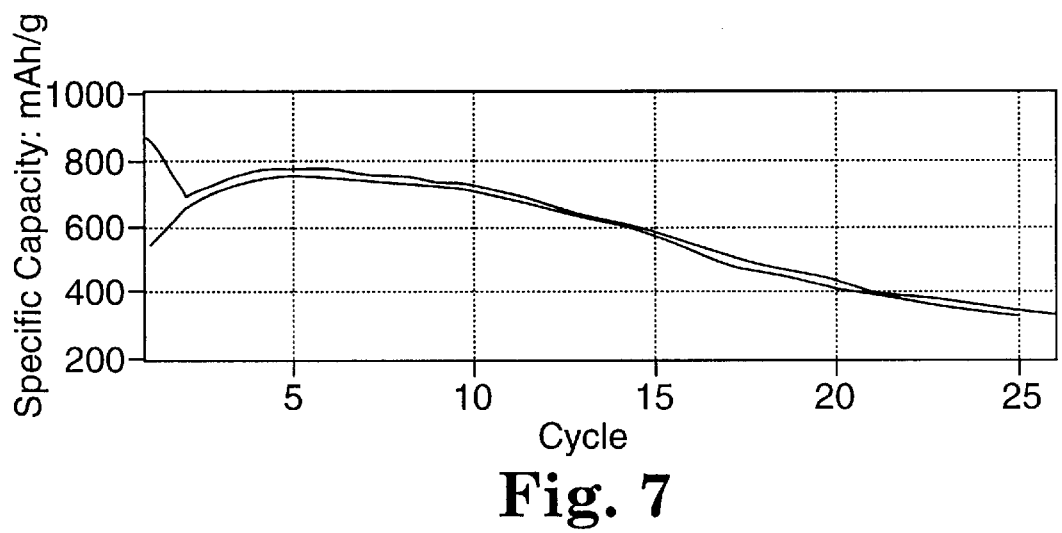
FIG. 7 illustrates the cycling performance, in terms of reversible specific capacity, of the germanium-nickel-silicon-aluminum sample described in Example 2.

The electrochemical performance of the cell was measured using a MACCOR cycler. The first discharge of the cell was a constant current discharge at 0.5 mA/cm² down to 5 mV and then a constant voltage (5 mV) discharge until the current fell to 50 microamps/cm². The initial discharge (lithiation) specific capacity was about 800 mAh/g. The cell was then cycled under conditions set for constant current charge and discharge at approximately a C/3 rate (0.5 mA/cm²) with cutoff voltages of 5 mV and 1.4 V. The reversible specific capacity is shown in FIG. 7. The results demonstrate that the electrode film will reversibly cycle at greater than 400 mAh/g for at least 20 cycles.

Figure 8A:
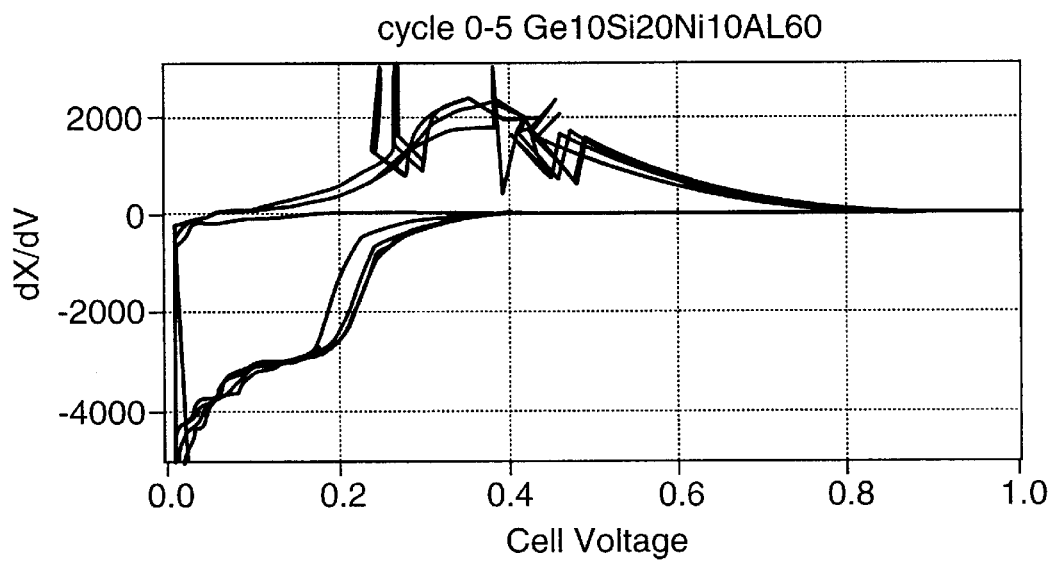
FIGS. 8A and 8B are differential voltage curves obtained for the germanium-nickel-silicon-aluminum sample described in Example 2.
Figure 8B:
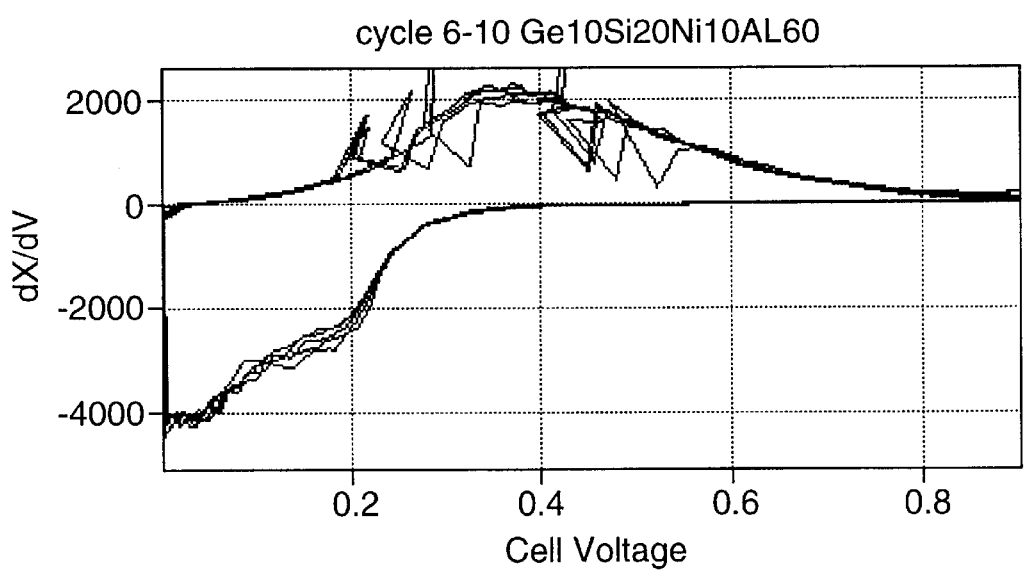

The differential voltage curves for the electrode are shown in FIGS. 8A (cycles 0–5) and 8B (cycles 6–10). The curves show that there are no significant changes in the electrochemical behavior of the electrode during cycling, indicating that no crystalline regions developed upon cycling.

Figure 9:
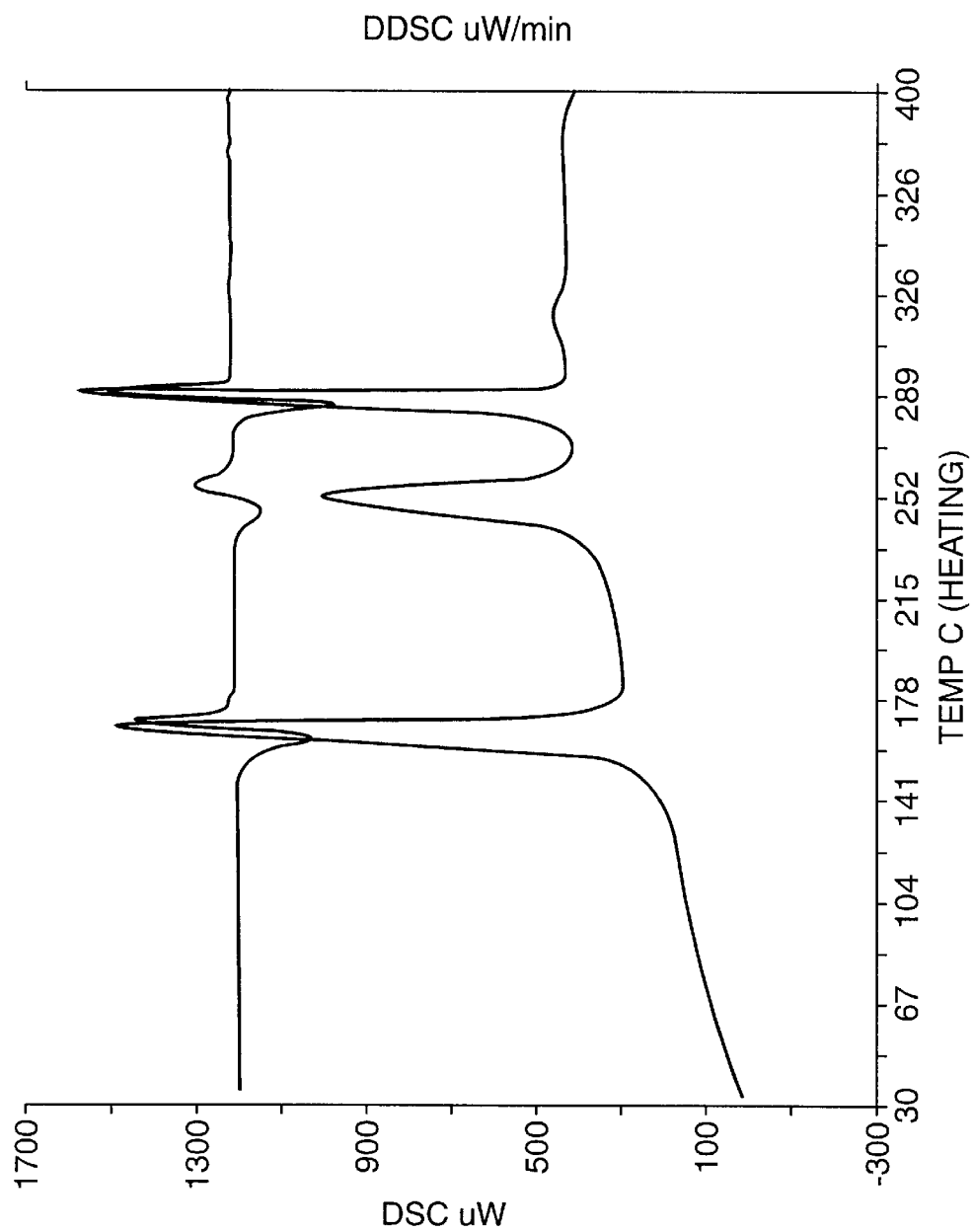
FIG. 9 illustrates the results of a differential scanning calorimetry test performed using the germanium-nickel-silicon-aluminum sample described in Example 2.

The crystallization temperature of the film was determined by a differential scanning calorimetry (DSC) using a Seiko Instruments DSC220C model calorimeter. A 1.58 mg sample of the film was used. The calorimeter was programmed to stabilized at 25EC for 20 minutes, then ramp from 25EC to 450EC at a rate of 5EC/minute, and finally to ramp from 450EC to 25EC at a rate of 10EC/minute. During the test, the sample chamber was flooded with argon gas. The results are shown in FIG. 9 and demonstrate that the sample has a crystallization temperature of greater than 150EC.

EXAMPLE 3

An amorphous film containing 74 wt. % aluminum-silicon (50 wt. % aluminum and 24 wt. % silicon) and 26 wt. % copper was prepared by sputter deposition according to Sputtering Procedure #1 described above from an aluminum-silicon target and a copper target. Based upon elemental analysis, the aluminum-silicon target contained 68 wt. % aluminum and 32 wt. % silicon. Deposition was accomplished under 12 mTorr of argon using a substrate rotation rate of 38 rpm. The sputter rates were 180 angstroms/minute for the aluminum-silicon target and 18 angstroms/minute for the copper target. The sputter-deposited film had a thickness of 4.61 microns and a density of about 3.13 g/cm³. The sample also had a 300 angstrom thick pre-layer of copper and a 300 angstrom thick post-layer of aluminum-silicon.

Figure 10:
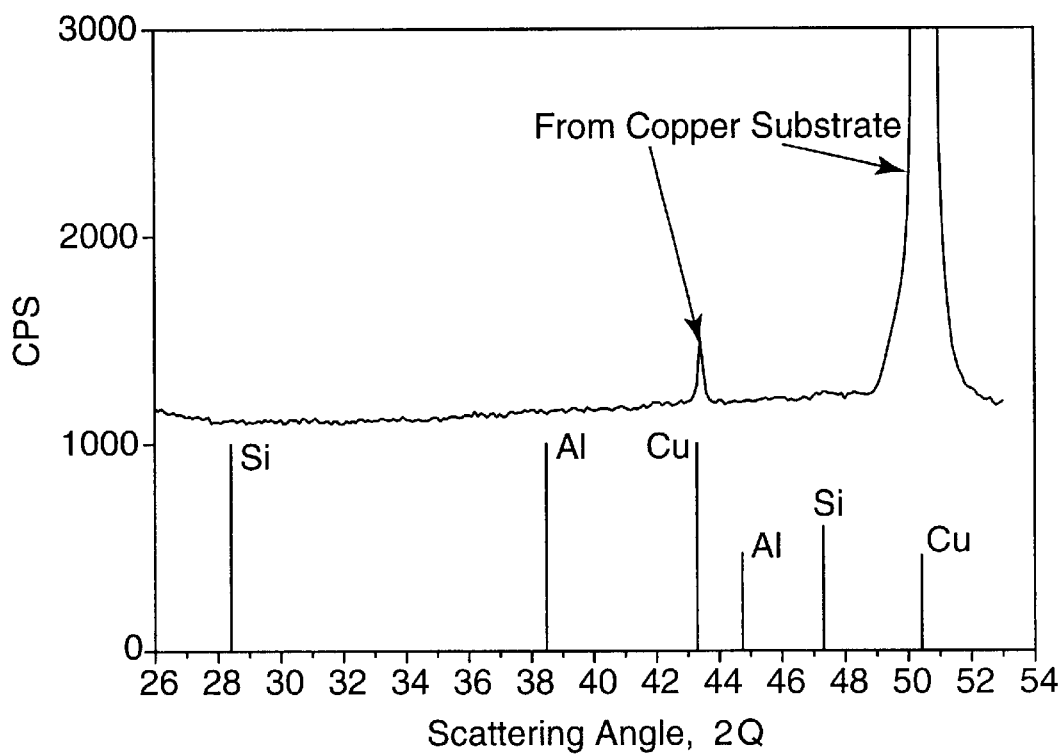
FIG. 10 is an x-ray diffraction profile for the aluminum-silicon-copper sample described in Example 3, obtained prior to cycling.

The x-ray diffraction profile of the film was measured according to the procedure described above using a copper target x-ray tube and is set forth in FIG. 10. All peaks present originate from copper used in the sample backing. This is demonstrated by the fact that an x-ray diffraction profile taken of a film prepared according to the same procedure but with the copper backing removed does not exhibit these peaks.

Figure 11:
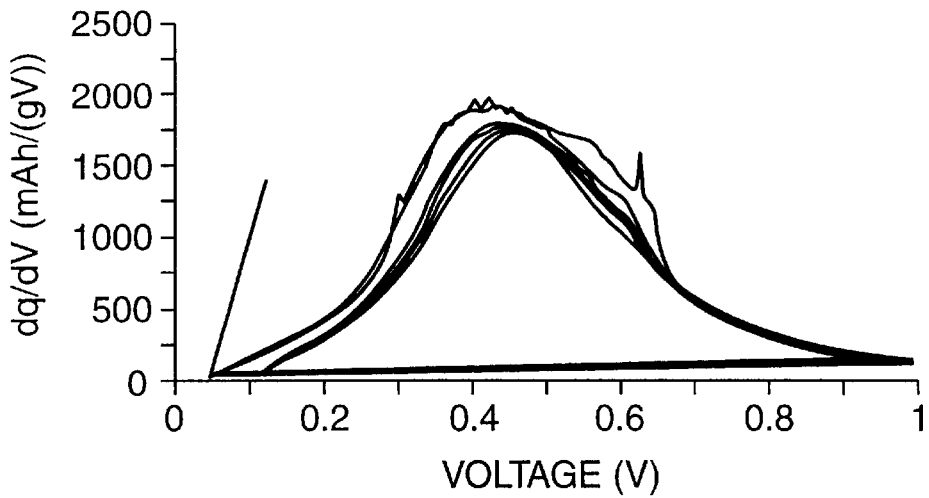
FIG. 11 is a differential voltage curve obtained for the aluminum-silicon-copper sample described in Example 3.
Figure 12:
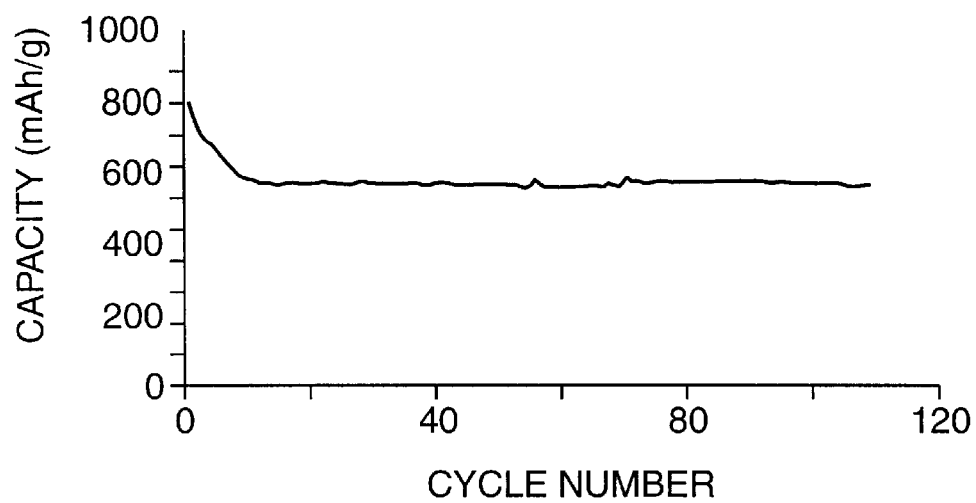
FIG. 12 illustrates the cycling performance, in terms of reversible specific capacity, of the aluminum-silicon-copper sample described in Example 3.

The cycling behavior of the film was tested following the procedure described in Example 1. FIG. 11 illustrates the differential capacity of the sample measured during the first 6 cycles of charge. The differential capacity is smooth and featureless, consistent with the absence of crystalline material. The reversible capacity of the film, measured at C/40, was about 700 mAh/g for the first two recharge cycles. As shown in FIG. 12, the sample retained a capacity of about 600 mAh/g for over 100 cycles at C/10.

EXAMPLE 4

An amorphous film containing 30 wt. % silicon, 66 wt. % tin, and 4 wt. % copper was prepared by sputter deposition according to Sputtering Procedure #2 described above using 11 kW total power for the three individual targets. The sputtering was conducted under 30 mTorr of argon using a web speed of 0.24 ft/min. Three targets of identical silicon/tin/copper composition were sputter deposited at a rate of about 3 grams/kwh. A 10 micron thick copper foil (Japan) coated with a binder was used as the backing. The backing was prepared by coating the foil with a 6 wt. % solids dispersion of 40 wt. % Super P carbon and 60 wt. % polyvinylidene fluoride in N-methyl-2-pyrrolidinone using an 8 mil notch bar, followed by drying under vacuum at 60° C. for 4 hours to remove residual solvent. The dry binder thickness was about 8 microns. The sputter deposited film had a thickness of about 5 microns and a density of about 4 g/cm³.

Figure 15:
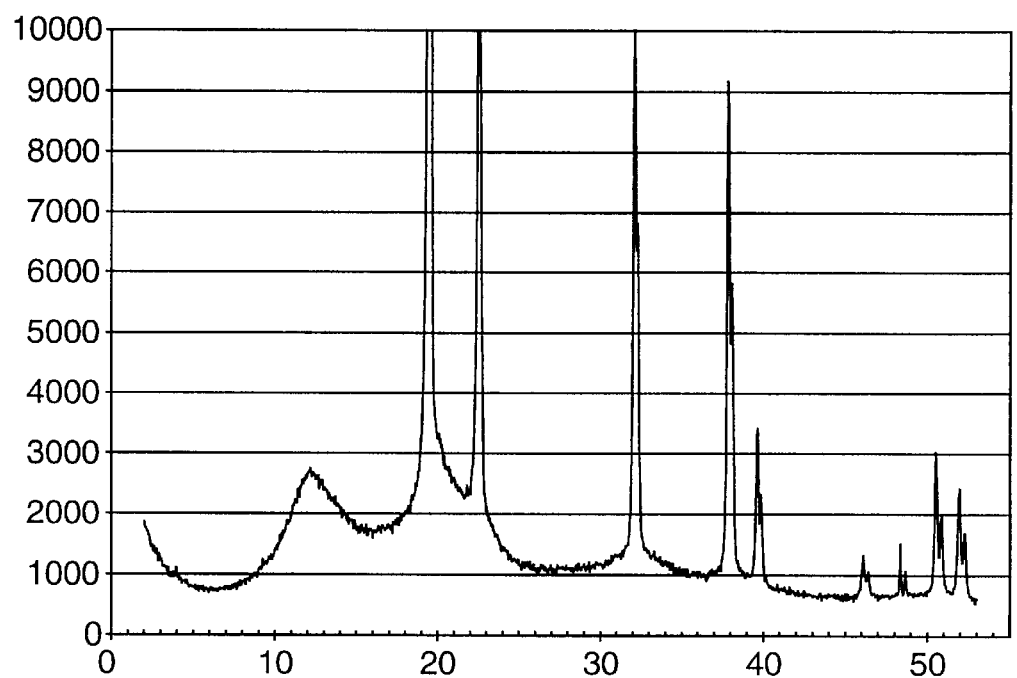
FIG. 15 is an x-ray diffraction profile for the silicon-tin-copper sample having an electrically conductive layer described in Example 4, obtained prior to cycling.

The x-ray diffraction profile of the silicon-tin-copper material was obtained using a molybdenum target x-ray tube and is set forth in FIG. 15. It is characterized by the absence of crystalline tin and silicon. The large peaks are due to the copper foil current collector.

With the help of acetone, the film was scraped from the copper backing using a razor blade, pulverized, and sieved using a 270-mesh sieve (U.S. standard sieve size; ASTM E-11-61). This material was then used to construct a 2325 coin cell for in situ x-ray diffraction measurements. To prepare the coin cell, a dispersion was prepared having 86 wt. % of the material, 7 wt. % Super-P carbon (MMM Carbon, Belgium), and 7 wt. % polyvinylidene fluoride binder in N-methyl-2-pyrrolidinone. The dispersion was then coated onto a copper foil and dried under vacuum for several hours to remove residual solvent. The resulting coated foil was to construct the 2325 coin cell using a lithium foil (about 300 micrometers thick, available from Aldrich Chemical Co. of Milwaukee, Wis.) as the counterelectrode. The cell was constructed using a 50 micrometer thick polyethylene separator. The electrolyte was 1 molal LiPF$_6$ in a 1:1 v/v mixture of ethylene carbonate and diethyl carbonate.

Figure 13A:
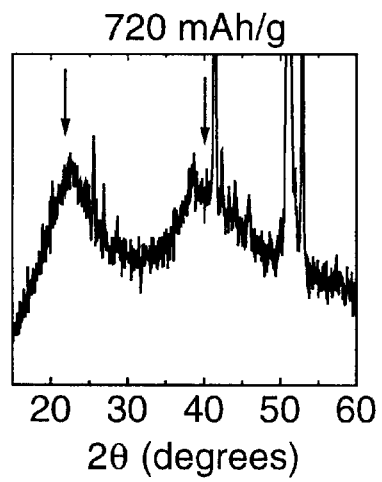
FIGS. 13(a)–(d) are in-situ x-ray diffraction scans obtained from a cell constructed using the silicon-tin-copper sample described in Example 4.
Figure 13B:
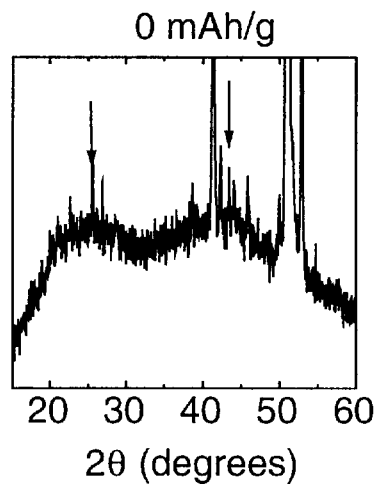

In situ x-ray diffraction measurements were performed as described above using a copper target x-ray tube. The results are shown in FIGS. 13(a)–(d). FIG. 13(d) shows the initial pattern of the electrode before the discharge current was initiated. All sharp peaks in the pattern originate from components of the cell (e.g., beryllium, beryllium oxide on the window, etc.). These peaks do not change during charge and discharge. The broad peaks centered near 26 and 43 degrees are due to the silicon-tin-copper electrode.

Figure 13C:
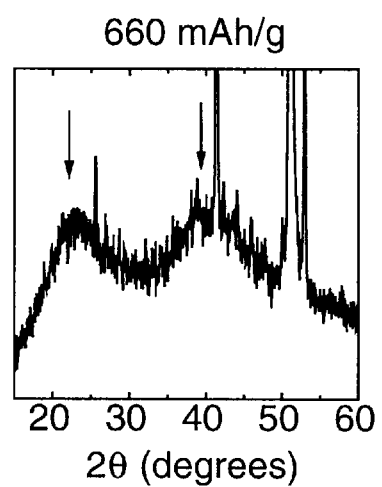
Figure 13D:
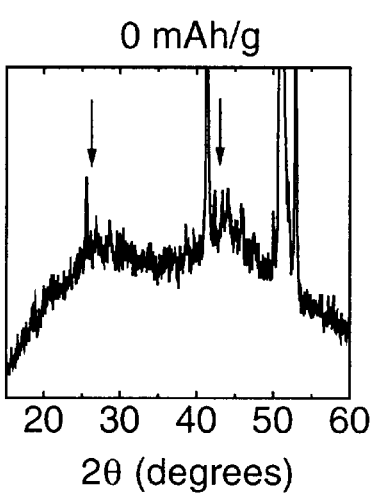

FIG. 13(c) shows the x-ray diffraction pattern measured after 660 mAh/g of lithium has been incorporated with the electrode. As shown in the figure, the broad peaks have shifted in position due to the reaction of lithium. The peaks remain broad. No evidence of crystallization is observed.

FIG. 13(b) shows the state of the electrode after the first removal of all the lithium. The pattern returns to that of the original material shown in FIG. 13(d). Again, no evidence of crystallization is observed.

FIG. 13(a) shows the state of the electrode after lithium has been inserted again to the level of 720 mAh/g. Once again, no evidence of crystallization is observed.

EXAMPLE 5

An electrode was prepared following the procedure of Example 4 except that the final dispersion used to prepare the electrode was made by mixing 1 gram of the sieved powder and 16 grams of a 4.5% solids dispersion of Super P carbon and polyvinylidene chloride (70:30) in N-methyl-2-pyrrolidinone. The final dried coating contained 50 wt. % active silicon-tin-copper, 35 wt. % Super P carbon, and 15 wt. % polyvinylidene fluoride. The electrode was used to construct a 2325 coin cell as described in Example 4.

The electrochemical performance of the cell, in terms of trickle charge capacity and charge rest voltage, was measured using a MACCOR cycler. The cell was first discharged at a high rate of 350 mA/g to a fixed capacity of 700 mAh/g to lithiate the electrode. The cell was then charged at a rate of 350 mA/g to a voltage of 1.2V to extract lithium from the electrode. Next, the cell was allowed to rest (zero current) for 15 minutes, after which the cell voltage may drop below 1.0V. The potential at the end of this rest period was recorded as the "charge rest voltage." It provides a measure of the amount of lithium remaining in the electrode. In general, the higher the charge rest voltage and the more stable it is versus cycle number, the more effectively lithium is being removed.

At the end of the rest period, the cell was charged at a low rate ("trickle charge") of 35 mA/g to 1.2V to remove any lithium not removed at the higher rate (350 mA/g). The trickle charge capacity is a measure of the extent of lithium removal and is analogous to coulombic efficiency. In general, the more lithium removed during application of the trickle charge, the less effective the electrode is at giving up lithium during the high rate charge. Accordingly, it is desirable to minimize the trickle charge capacity for a given cycle, and to maintain a low trickle charge capacity after repeated cycling.

Figure 14:
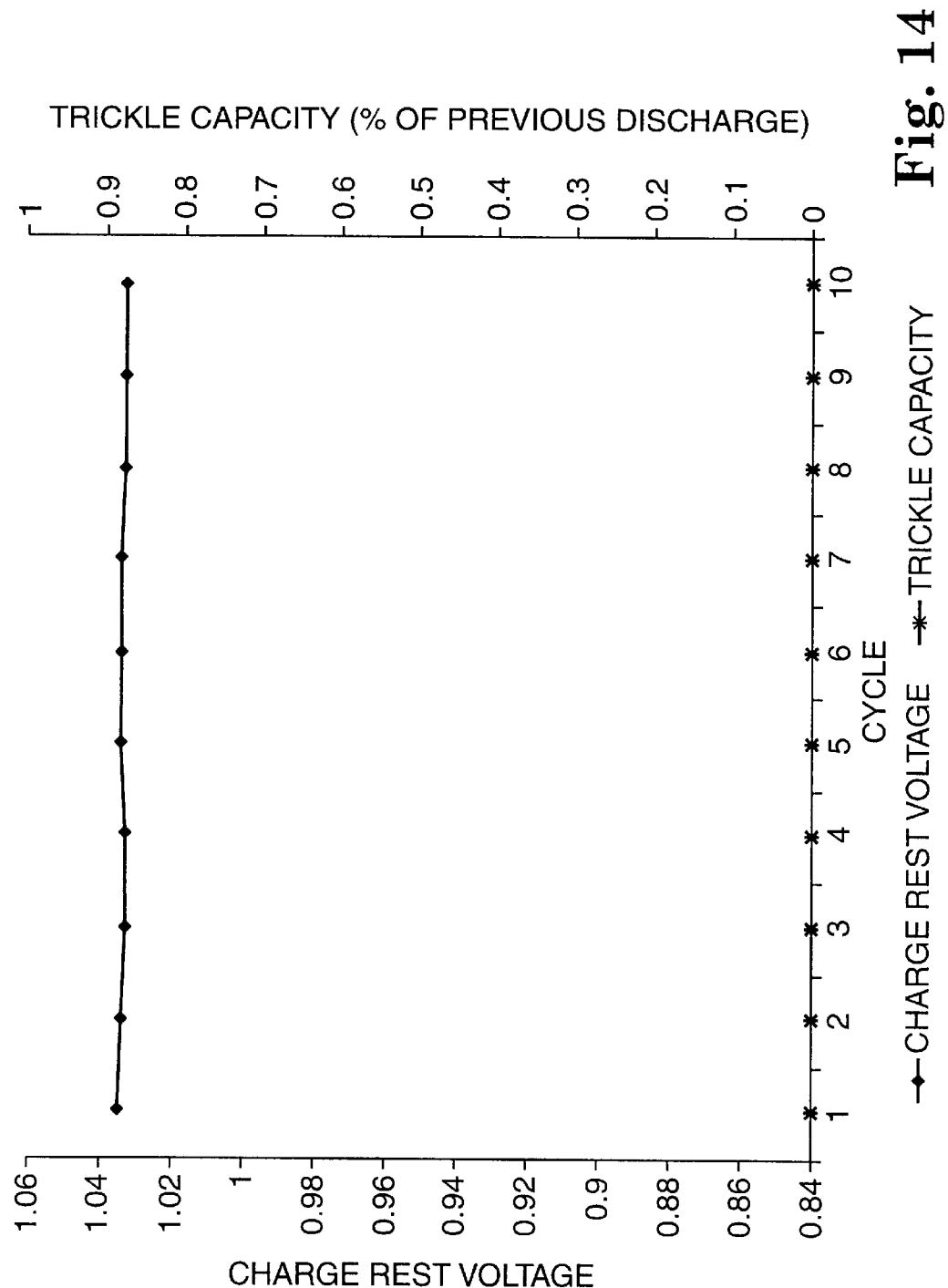
FIG. 14 illustrates the cycling performance, in terms of charge rest voltage and trickle charge, of the silicon-tin-copper sample having an electrically conductive layer described in Example 5.

The results for the sample are shown in FIG. 14. The results demonstrate that the electrode performs well, both in terms of trickle charge and charge rest voltage.

EXAMPLE 6

Figure 16:
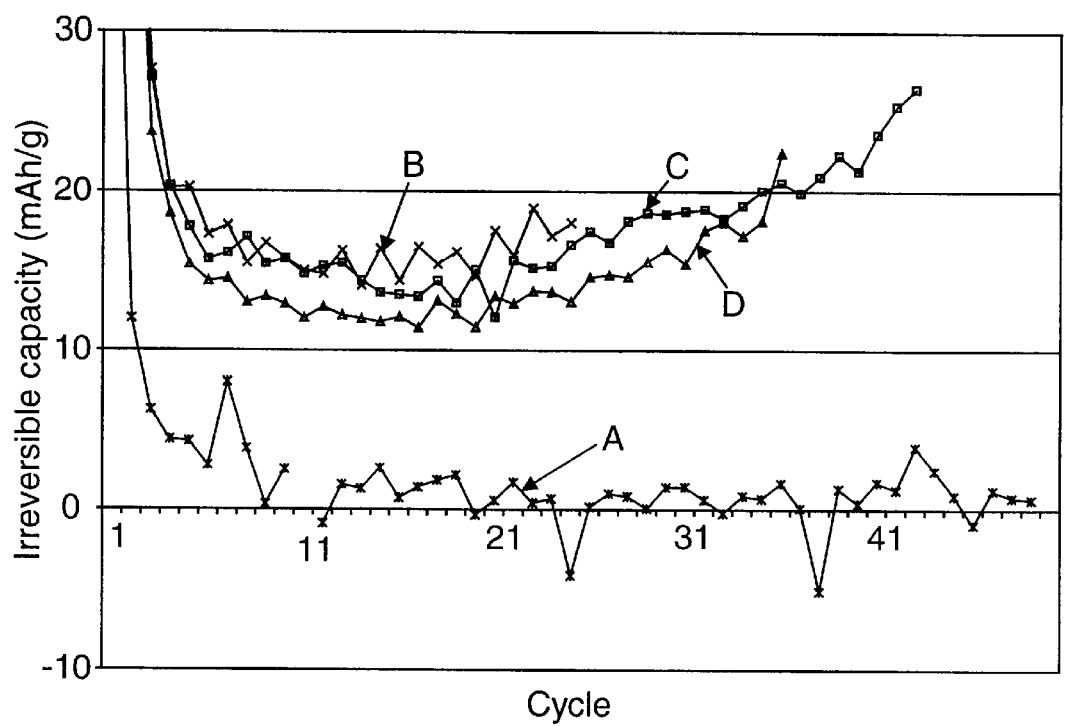
FIG. 16 illustrates the cycling performance, in terms of irreversible capacity, of the annealed and unannealed silicon-tin-copper samples described in Example 6.

An amorphous film containing 30 wt. % silicon, 66 wt. % tin, and 4 wt. % copper was prepared as described in Example 4, and cycled according to the protocol described in Example 5. The irreversible capacity of this film was calculated as the difference between the discharge and charge capacity after each cycle. For the sake of comparison, three other films were prepared but they were annealed at 150° C. for 24 hours in a vacuum oven prior to measuring its irreversible capacity as a function of cycle number. Annealing results in the production of a semi-crystalline film. The results for all four films are shown in FIG. 16. The amorphous film is labeled "A" in FIG. 16 and was cycled at a four hour rate. The annealed films were labeled "B", "C", and "D", and were cycled at rates of six, two, and four hours, respectively. The results demonstrate that the amorphous film had an irreversible capacity that was significantly lower that that of the annealed films.

Other embodiments are within the scope of the following claims.

What is claimed is:

1. An electrode composition comprising:
   an electrode material consisting essentially of aluminum, silicon, and manganese in the form of an amorphous mixture at ambient temperature that remains amorphous when said electrode composition is incorporated into a lithium battery and cycled through at least one full charge-discharge cycle at ambient temperature.

2. An electrode composition comprising:
   an electrode material consisting essentially of germanium, nickel, silicon, and aluminum in the form of an amorphous mixture at ambient temperature that remains amorphous when said electrode composition is incorporated into a lithium battery and cycled through at least one full charge-discharge cycle at ambient temperature.

3. An electrode composition according to claim 1, wherein said comprising:
   an electrode material consisting essentially of aluminum, silicon, and copper in the form of an amorphous mixture at ambient temperature that remains amorphous when said electrode composition is incorporated into a lithium battery and cycled through at least one full charge-discharge cycle at ambient temperature.

4. An electrode composition comprising:
   an electrode material consisting essentially of silicon, tin, and copper in the form of an amorphous mixture at ambient temperature that remains amorphous when said electrode composition is incorporated into a lithium battery and cycled through at least one full charge-discharge cycle at ambient temperature.

* * * * *

UNITED STATES PATENT AND TRADEMARK OFFICE
CERTIFICATE OF CORRECTION

PATENT NO.       : 6,699,336 B2
APPLICATION NO.  : 09/751169
DATED            : March 2, 2004
INVENTOR(S)      : Turner, Robert L.

It is certified that error appears in the above-identified patent and that said Letters Patent is hereby corrected as shown below:

Column 2,
Line 34, delete "is a 1" after "FIG. 1".

Column 3,
Line 54, delete "$LiCo_{o\ 2}$" and insert -- $LiCo_{0.2}$ --.

Column 4,
Line 27, delete "insure" and insert -- ensure --.

Column 5,
Line 18, delete "12" and insert -- 1–2 --.

Column 6,
Line 7, delete "can" after "cell".

Column 7,
Line 19, delete "20" and insert -- 10 --.
Line 20, after "nickel," delete "10" and insert -- 20 --.
Line 67, delete "stabilized" and insert -- stabilize --.

Column 9,
Line 10, insert -- used -- after "was".

Column 10,
Line 31, delete "that" and insert -- than --.
Line 50, delete "according to claim 1, wherein said" after "composition".

Signed and Sealed this

Twentieth Day of June, 2006

JON W. DUDAS
*Director of the United States Patent and Trademark Office*